(12) United States Patent
Olson et al.

(10) Patent No.: US 10,460,053 B2
(45) Date of Patent: Oct. 29, 2019

(54) SYSTEMS AND METHODS FOR SURFACE PROPERTY IDENTIFICATION USING WAVEFORM CLASSIFICATION

(71) Applicant: Toyota Research Institute, Inc., Los Altos, CA (US)

(72) Inventors: Edwin B. Olson, Ann Arbor, MI (US); Michael R. James, Northville, MI (US); Ryan M. Eustice, Ann Arbor, MI (US)

(73) Assignee: Toyota Research Institute, Inc., Los Altos, CA (US)

( * ) Notice: Subject to any disclaimer, the term of this patent is extended or adjusted under 35 U.S.C. 154(b) by 227 days.

(21) Appl. No.: 15/495,725

(22) Filed: Apr. 24, 2017

(65) Prior Publication Data

US 2018/0306924 A1    Oct. 25, 2018

(51) Int. Cl.
| | | |
|---|---|---|
| *G06F 17/50* | (2006.01) | |
| *G01J 3/50* | (2006.01) | |
| *G01S 7/497* | (2006.01) | |
| *G01S 17/42* | (2006.01) | |
| *G01S 17/89* | (2006.01) | |
| *G01S 17/93* | (2006.01) | |
| *G06N 20/00* | (2019.01) | |
| *G01S 7/48* | (2006.01) | |

(52) U.S. Cl.
CPC ............ *G06F 17/5009* (2013.01); *G01J 3/50* (2013.01); *G01S 7/4802* (2013.01); *G01S 17/42* (2013.01); *G06N 20/00* (2019.01); *G01S 7/497* (2013.01); *G01S 17/89* (2013.01); *G01S 17/936* (2013.01)

(58) Field of Classification Search
CPC ........ G06F 17/5009; G06N 20/00; G01J 3/50; G01S 17/023; G01S 17/42; G01S 17/89; G01S 17/936; G01S 7/4802; G01S 7/497
See application file for complete search history.

(56) References Cited

U.S. PATENT DOCUMENTS

| | | | |
|---|---|---|---|
| 8,379,928 B2 * | 2/2013 | Kuoch | B60R 21/0134 340/436 |
| 2011/0060478 A1 * | 3/2011 | Nickolaou | G01S 17/023 701/1 |
| 2014/0122409 A1 | 5/2014 | Na et al. | |
| 2014/0309836 A1 * | 10/2014 | Ollis | G08G 1/22 701/25 |
| 2016/0014395 A1 | 1/2016 | Murray et al. | |

(Continued)

FOREIGN PATENT DOCUMENTS

WO    WO2014189059 A1    11/2014

*Primary Examiner* — Manuel L Barbee
(74) *Attorney, Agent, or Firm* — Christopher G. Darrow; Darrow Mustafa PC (57) ABSTRACT

System, methods, and other embodiments described herein relate to identifying surface properties of objects using a light detection and ranging (LIDAR) sensor. In one embodiment, a method includes, in response to scanning a surface of an object using the LIDAR sensor, receiving a reflected waveform as a function of attributes of the surface. The method includes analyzing the reflected waveform according to a surface property model to produce an estimate of the attributes. The surface property model characterizes relationships between reflected waveforms and different surface properties. The method includes providing the estimate as an indication of the surface of the scanned object.

20 Claims, 5 Drawing Sheets

(56) References Cited

U.S. PATENT DOCUMENTS

| | | |
|---|---|---|
| 2016/0178802 A1 | 6/2016 | Stanvas Olshansky et al. |
| 2016/0299228 A1 | 10/2016 | Maleki et al. |
| 2016/0370462 A1* | 12/2016 | Yang ................... G01S 17/46 |
| 2017/0177954 A1* | 6/2017 | Micks ................... G06K 9/209 |
| 2017/0316684 A1* | 11/2017 | Jammoussi ............ G06T 11/60 |
| 2018/0180715 A1* | 6/2018 | Park ..................... G01S 7/484 |
| 2018/0276832 A1* | 9/2018 | Aikin ................... G06T 7/40 |

* cited by examiner

SYSTEMS AND METHODS FOR SURFACE PROPERTY IDENTIFICATION USING WAVEFORM CLASSIFICATION

TECHNICAL FIELD

The subject matter described herein relates in general to systems for identifying surface properties of an object and, more particularly, to training a surface property model using reflected waveforms from objects having known properties so that the surface property model can be used to analyze reflected waveforms from unknown objects to estimate associated surface properties.

BACKGROUND

LIDAR sensors are valuable tools for obtaining information about surroundings in an environment such as distances to various objects, types of objects, and so on. Consequently, LIDAR sensors are becoming more common in vehicles and especially in autonomous vehicles. However, while LIDAR sensors can be highly accurate and useful for identifying objects according to a basic shape and for determining distances to the objects, these sensors generally do not provide further information. For example, when a LIDAR sensor scans an environment, the sensor emits waveforms that are then reflected off of objects. The LIDAR sensor detects the reflected waveforms and, for example, constructs point clouds that identify points on surfaces of objects in the environment from which the waveforms reflected.

The LIDAR sensor can combine these points to generate representations of objects according to the reflected points. The point clouds provided by the LIDAR sensor can identify various objects such as vehicles, people, etc. However, the LIDAR sensor does not provide information beyond the simple points. Thus, additional aspects of objects can be difficult to determine especially when other sensors, such as cameras, are unavailable or cannot perceive an object due to environmental conditions.

SUMMARY

An example of a surface identification system is presented herein. In one embodiment, the surface identification system first trains a surface property model so that the surface property model can be subsequently employed to identify surface properties of unknown objects. For example, the surface identification system can use a LIDAR sensor to gather training set information by scanning objects that have known surface properties. Subsequently, the surface identification system logs or otherwise links the known surface properties to received reflected waveforms acquired by the LIDAR sensor. The resulting database of reflected waveforms and known surface properties can be used to, for example, identify signatures of surface properties within the reflected waveforms and to produce a surface property model. Consequently, the LIDAR sensor can analyze reflected waveforms from unknown objects using the surface property model to identify surface properties of the unknown objects. In this way, additional information about objects can be obtained using the LIDAR sensor beyond a shape and range of the objects.

In one embodiment, a surface identification system for identifying surface properties of objects using a light detection and ranging (LIDAR) sensor is disclosed. The surface identification system includes one or more processors and a memory that is communicably coupled to the one or more processors. The memory stores an identification module including instructions that when executed by the one or more processors cause the one or more processors to, in response to scanning a surface of an object using the LIDAR sensor, receive a reflected waveform as a function of attributes of the surface. The identification module includes instructions to analyze the reflected waveform according to a surface property model to produce an estimate of the attributes. The surface property model characterizes relationships between reflected waveforms and different surface properties. The identification module includes instructions to provide the estimate as an indication of the surface of the scanned object.

In one embodiment, a non-transitory computer-readable medium for identifying surface properties of objects using a light detection and ranging (LIDAR) sensor is disclosed. The computer-readable medium stores instructions that when executed by one or more processors cause the one or more processors to perform the disclosed functions. The instructions include instructions to, in response to scanning a surface of an object using the LIDAR sensor, receive a reflected waveform as a function of attributes of the surface. The instructions include instructions to analyze the reflected waveform according to a surface property model to produce an estimate of the attributes. The surface property model characterizes relationships between reflected waveforms and different surface properties. The instructions include instructions to provide the estimate as an indication of the surface of the scanned object.

In one embodiment, a method for identifying surface properties of objects using a light detection and ranging (LIDAR) sensor is disclosed. The method includes, in response to scanning a surface of an object using the LIDAR sensor, receiving a reflected waveform as a function of attributes of the surface. The method includes analyzing the reflected waveform according to a surface property model to produce an estimate of the attributes. The surface property model characterizes relationships between reflected waveforms and different surface properties. The method includes providing the estimate as an indication of the surface of the scanned object.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Systems, methods and other embodiments associated with using a LIDAR sensor to identify surface properties of an object are disclosed. As mentioned previously, a LIDAR sensor can detect a general shape and location of an object. However, the LIDAR sensor may not be configured to provide additional information about the object. For example, in some circumstances, a vehicle to which the LIDAR sensor is mounted may have a use for additional information about a detected object such as color, a type of a surface (e.g., material and smoothness), and so on. The additional information can be useful in, for example, precisely identifying the detected object when operating the vehicle autonomously and/or to generally otherwise classify the object.

Accordingly, in one embodiment, a surface identification system trains a surface property model by using a LIDAR sensor to obtain reflected waveforms from objects with known surface properties. Subsequently, the surface identification system can derive identifying features from the reflected waveforms that correlate with the associated surface properties. For example, because the reflected waveforms are transformed when reflecting from the surfaces of the objects and according to particular properties of the surfaces, the reflected waveforms are imparted with and thus carry information about the surface properties. In one embodiment, the surface identification system analyzes the reflected waveforms acquired from objects with the known surface properties to identify correlations/relationships between surface properties and attributes of the reflected waveforms. The surface identification system can then use the correlations/relationships that are trained or otherwise stored by a surface property model to subsequently estimate surface properties for objects with unknown surface properties.

For example, the surface property model can be loaded into the LIDAR sensor or can be maintained separately. In either case, the surface identification system, in one embodiment, uses the surface property model to analyze reflected waveforms from objects when scanning an environment. The surface identification system can then estimate surface properties of an object according to the surface property model. In this way, the surface identification system can provide additional information about objects so that the objects can be classified and/or otherwise identified to a greater specificity.

Figure 1:
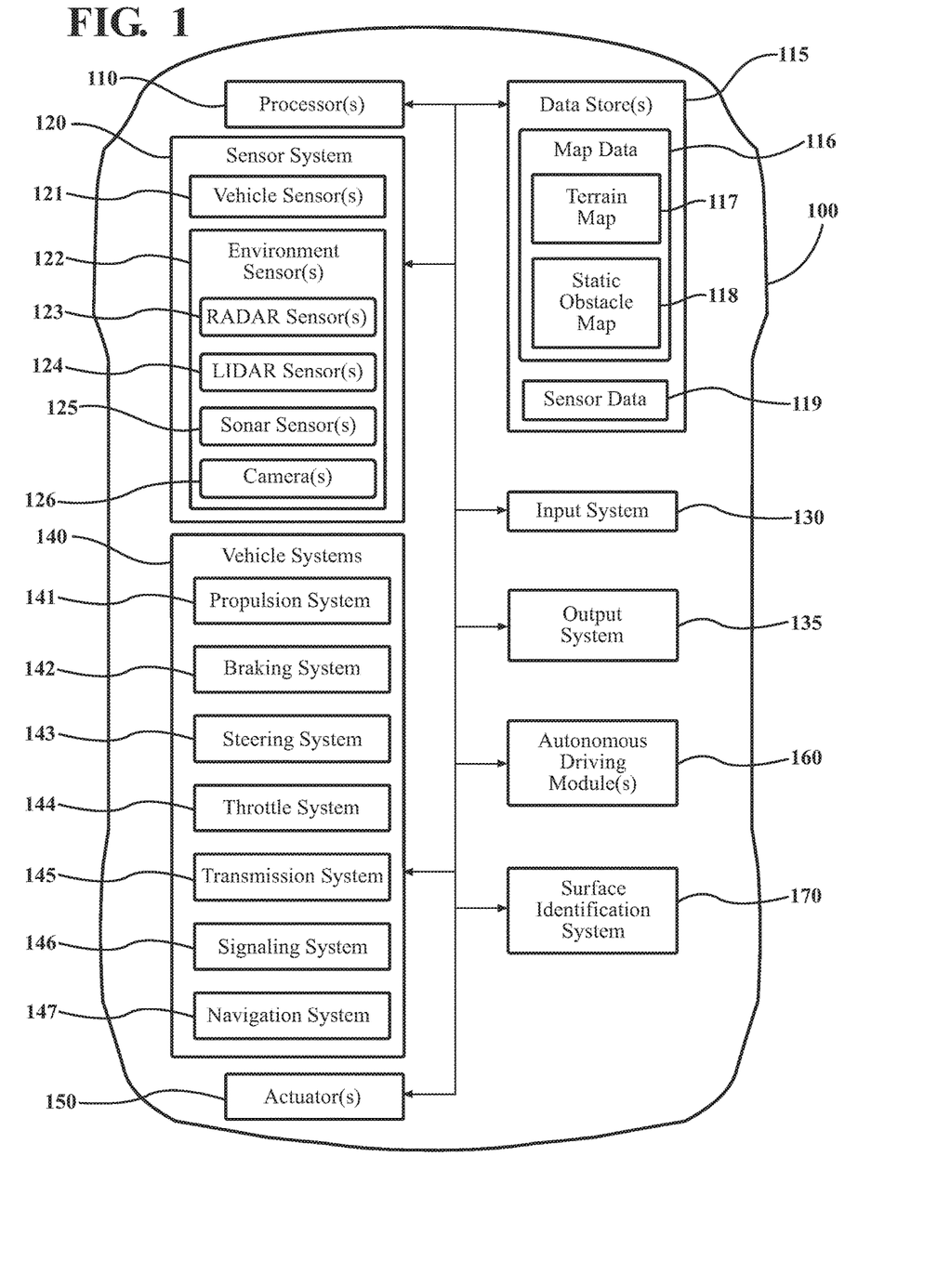
FIG. 1 illustrates one embodiment of a vehicle within which systems and methods disclosed herein may be implemented.

Referring to FIG. 1, an example of a vehicle 100 is illustrated. As used herein, a "vehicle" is any form of motorized transport. In one or more implementations, the vehicle 100 is an automobile. While arrangements will be described herein with respect to automobiles, it will be understood that embodiments are not limited to automobiles. In some implementations, the vehicle 100 may be any other form of motorized transport that, for example, includes a LIDAR sensor or similar sensor and thus benefits from the ability to differentiate/identify surface properties of objects as discussed herein.

The vehicle 100 also includes various elements. It will be understood that in various embodiments it may not be necessary for the vehicle 100 to have all of the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1. Further, while the various elements are shown as being located within the vehicle 100 in FIG. 1, it will be understood that one or more of these elements can be located external to the vehicle 100. Further, the elements shown may be physically separated by large distances.

Some of the possible elements of the vehicle 100 are shown in FIG. 1 and will be described along with subsequent figures. However, a description of many of the elements in FIG. 1 will be provided after the discussion of FIGS. 2-5 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

In either case, the vehicle 100 includes a surface identification system 170 that is implemented to perform methods and other functions as disclosed herein relating to identifying surface properties of objects using a LIDAR sensor. The noted functions and methods will become more apparent with a further discussion of the figures.

Figure 2:
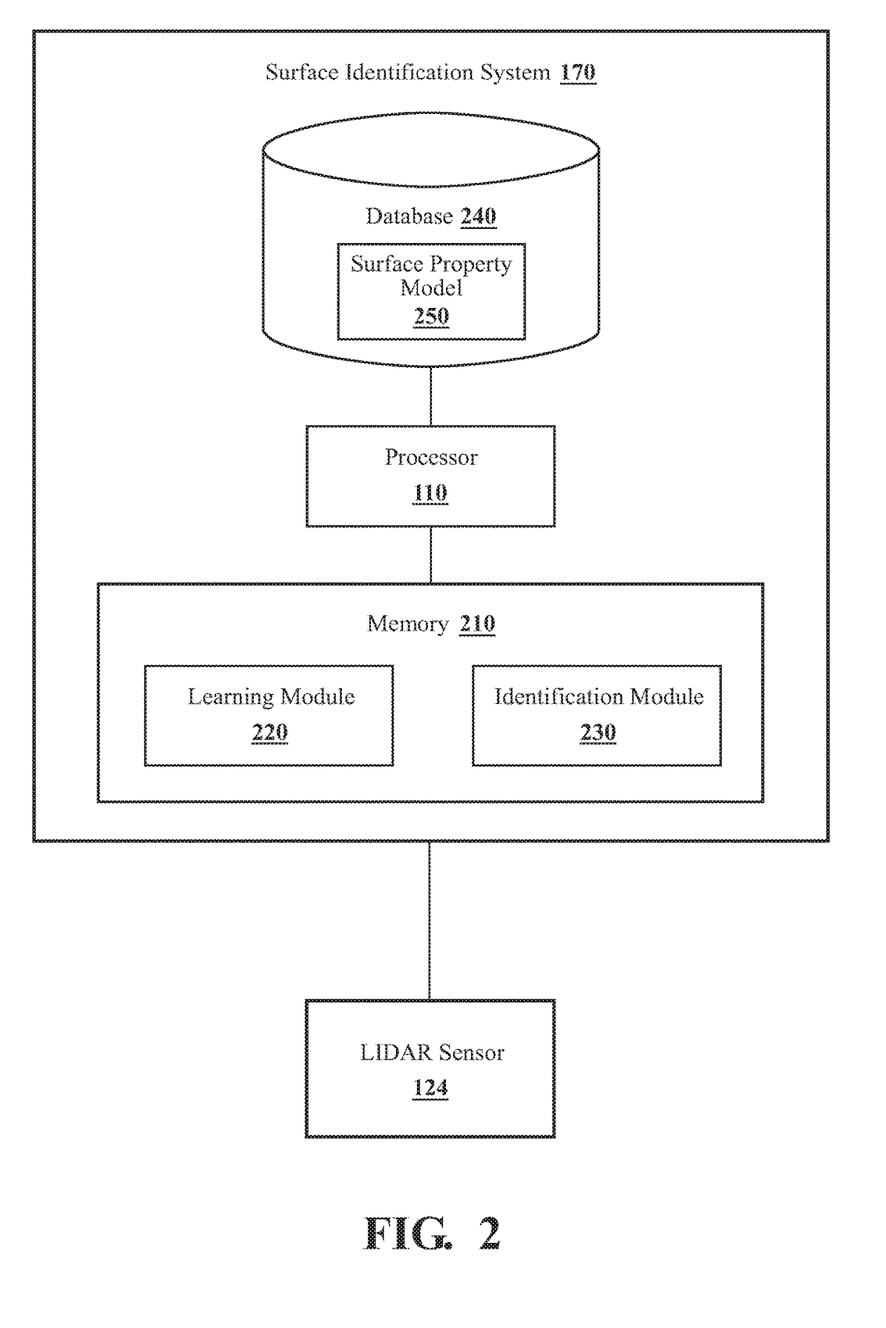
FIG. 2 illustrates one embodiment of a surface identification system that is associated with analyzing reflected waveforms to determine surface properties of an object.

With reference to FIG. 2, one embodiment of the surface identification system 170 of FIG. 1 is further illustrated. The surface identification system 170 is shown as including a processor 110 from the vehicle 100 of FIG. 1. Accordingly, the processor 110 may be a part of the surface identification system 170, the surface identification system 170 may include a separate processor from the processor 110 of the vehicle 100, or the surface identification system 170 may access the processor 110 through a data bus or another communication path. In one embodiment, the surface identification system 170 includes a memory 210 that stores a learning module 220 and an identification module 230. The memory 210 is a random-access memory (RAM), read-only memory (ROM), a hard-disk drive, a flash memory, or other suitable memory for storing the modules 220 and 230. The modules 220 and 230 are, for example, computer-readable instructions that when executed by the processor 110 cause the processor 110 to perform the various functions disclosed herein.

Accordingly, in one embodiment, the learning module 220 includes instructions that function to control the processor 110 to communicate with a LIDAR 124 of the vehicle 100 and control the LIDAR 124 to produce a scanning waveform. The scanning waveform is emitted by the LIDAR 124 into an area surrounding the vehicle 100 toward an object. The object has known surface properties, e.g., known material type, reflectivity, color, etc. Thus, the scanning waveform reflects off of a surface of the object and is altered according to the surface properties to produce a reflected waveform. In general, many factors influence changes to the scanning waveform that produce the reflected waveform. For example, an angle of incidence of the scanning waveform onto the surface of the object, a color of the surface, a material of the surface, a finish of the surface (e.g., roughness), and so on. Consequently, the scanning waveform is dispersed and/or otherwise transformed into the reflected waveform as a function of the surface properties.

In either case, the LIDAR 124 receives the reflected waveform and, for example, provides the reflected waveform to the learning module 220. In other words, the learning module 220 includes instructions to acquire data about the object by controlling the LIDAR sensor 124 to scan the object. The learning module 220 stores the reflected waveform (i.e., detected attributes of the reflected waveform) as, for example, a continuous amplitude response or other quantification in a database 240 or other suitable data store (e.g., the memory 210). Of course, while memories of the surface identification system 170 are discussed as storing the reflected waveforms, in one embodiment, the data can be stored within the LIDAR sensor 124 itself or otherwise diverted to distributed memory as controlled by the learning module 220.

With continued reference to the surface identification system 170, in one embodiment, the system 170 includes the database 240. The database 240 is, in one embodiment, an electronic data structure stored in the memory 210 or another data store and that is configured with routines that can be executed by the processor 110 for analyzing stored data, providing stored data, organizing stored data, and so on. Thus, in one embodiment, the database 240 stores data used by the modules 220 and 230 in executing various functions. In one embodiment, the database 240 includes the reflected waveforms along with information about a surface from which the reflected waveforms were reflected. For example, the learning module 220 stores the reflected waveforms along with identifying information about the surface properties of the object since the surface properties are known.

Thus, the learning module 220, through collecting the reflected waveforms for multiple different objects with different surface properties, generates a training data set that embodies relationships between reflected waveforms and surfaces of various objects. While the learning module 220 is discussed in relation to storing the reflected waveforms in the database 240, in various embodiments, the learning module 220 stores quantized characteristics of the reflected waveforms as perceived by the LIDAR sensor 124. For example, the learning module 220 stores a perceived wavelength, a phase, an intensity, and other perceived characteristics of the reflected waveforms that are useful in, for example, assessing relationships between the surfaces and the reflected waveforms. In a further embodiment, the learning module 220 can also store information about the scanning waveform, changes between the scanning waveform and the reflected waveform, current environmental conditions, and so on. Moreover, the perceived characteristics can be discrete samples, discrete samples over a define timer period, a continuous response, and/or another suitable form of characterizing the reflected waveform.

In either case, the learning module 220 processes the stored data about the reflected waveforms in order to generate a surface property model 250. The surface property model 250 is, in one embodiment, a lookup table, or other electronic data structure that facilitates identifying surface properties of unknown objects upon receiving a reflected waveform. Alternatively, in one embodiment, the learning module 220 produces the surface property model 250 according to a machine learning or deep learning algorithm. For example, in one embodiment, the learning module 220 uses the information previously stored in the database 240 as a training set for the learning algorithm. Thus, the learning module 220 implements a supervised learning algorithm to produce the surface property model 250. In one embodiment, the supervised learning algorithm is a generative algorithm, a discriminative algorithm, or another suitable technique for analyzing the stored data to determine signatures of the different surface properties embodied in the reflected waveforms.

Thus, in one embodiment, the learning module 220 analyzes the training data to determine distributions of different classes of surface properties in relation to the reflected waveforms. Alternatively, or additionally, the learning module 220 can analyze the training data to learn boundaries in the data that define the various classes of surface properties. In either case, the learning module 220 produces the surface property model 250 as a function of the training set by adjusting the surface property model 250 according to, for example, back propagation as separate reflected waveforms are analyzed.

The surface property model 250 is provided as, for example, an output of the learning module 220 for use by the identification module 230. The identification module 230 includes instructions that function to control the processor 110 to identify surface properties of objects upon receiving a reflected waveform by using the surface property model 250. It should be appreciated that while the surface identification system 170 is discussed as including both the learning module 220 and the identification module 230, in on embodiment, the modules 220 and 230 may be embodied in separate systems that are remote from one another. That is, for example, the learning module 220 can be embodied on a remote server to which the training data is provided and which provides the surface property model 250. In this way, the learning module 220 can accumulate data from multiple distributed LIDAR sensors in order to acquire more information for developing the training data set.

In either case, the identification module 230 uses the surface property model 250 to identify the surface properties for objects that are encountered, for example, while the vehicle 100 is operating and navigating to a destination. Thus, the identification module 230 can identify different aspects of the surface of objects to facilitate with classifying the objects, determining directions of travel of the objects, determining orientations (e.g., pose) of the objects, and so on.

Accordingly, the identification module 230 can continuously monitor a stream of data provided by a receiver of the LIDAR sensor 124 to determine when an object is present and, thus, when a reflected waveform is to be processed to identify surface properties. Alternatively, in one embodiment, the identification module 230 is initiated by an interrupt or other programming hook upon detection of an object or request for analysis of a reflected waveform. In either case, once the identification module 230 acquires a reflected waveform, the reflected waveform is, for example, decomposed into representative quantized attributes/characteristics so that the surface property model 250 can be applied to the reflected waveform. That is, the identification module 230 obtains data, in one embodiment, from the LIDAR sensor 124 in the form of a shift in wavelength between the scanning waveform and the reflected waveform, a shift in phase, a change in intensity (e.g., an amplitude response), and so on.

The various attributes or changes to the attributes are generally correlated with different surface properties of objects. Therefore, the identification module 230 uses the noted data elements to estimate the surface properties by classifying the characteristics according to the learned distributions embodied by the surface property model 250. In this way, the identification module 230 can provide an estimate of the surface properties.

Figure 3:
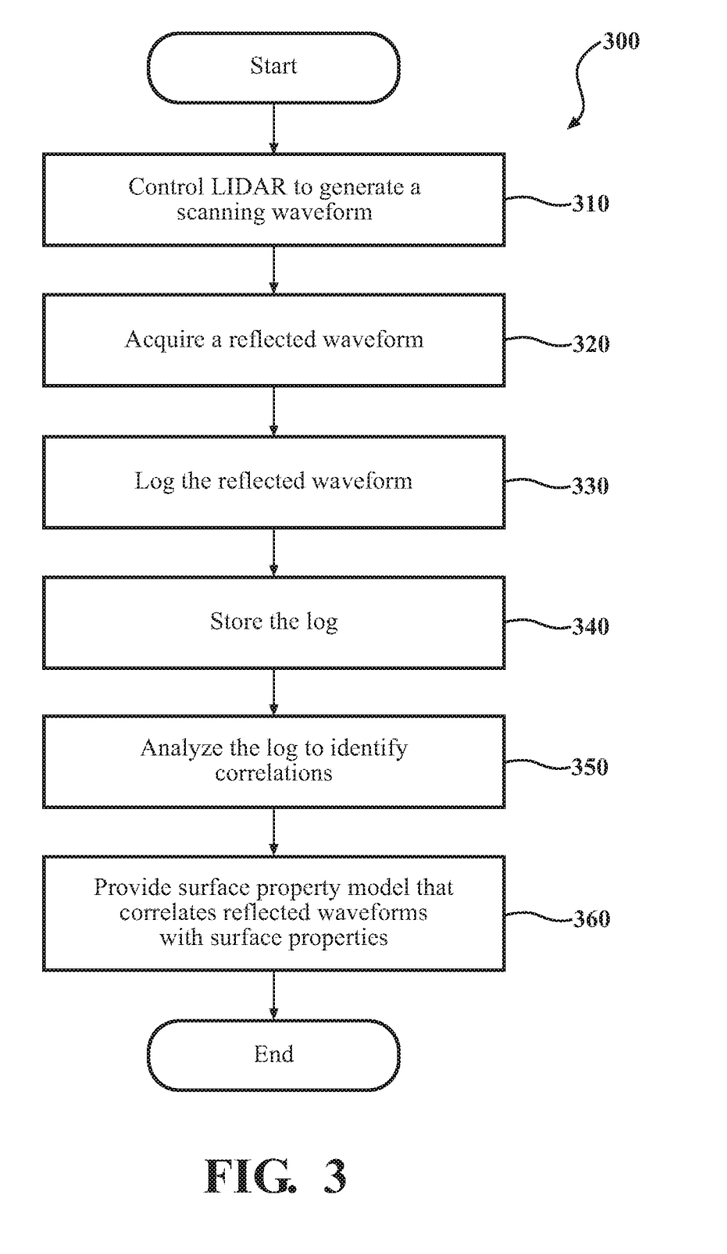
FIG. 3 illustrates one embodiment of a method that is associated with training a model using reflected waveforms from objects with known surface properties.

Additional aspects of generating the surface property model 250 and identifying surface properties using the surface property model 250 will be discussed in relation to FIG. 3 and FIG. 5, respectively. FIG. 3 illustrates a flowchart of a method 300 that is associated with developing a training set of data and producing a surface property model from the training set. Method 300 will be discussed from the perspective of the surface identification system 170 of FIGS. 1 and 2. While method 300 is discussed in combination with the surface identification system 170, it should be appreciated that the method 300 is not limited to being implemented within the surface identification system 170, but is instead one example of a system that may implement the method 300.

At 310, the learning module 220 controls the LIDAR sensor 124 to generate a scanning waveform. As previously noted, in one embodiment, the learning module 220 causes the LIDAR 124 to direct the scanning waveform to scan an object. The object is known in the sense of being previously identified and labeled according to, for example, surface properties of the object and other identifying characteristics. Alternatively, the object and characteristics of the object can be later identified/labeled through an out-of-band process. In either case, the surface properties of the object are or will be known so that the surface properties can be correlated with the reflected waveform as subsequently discussed.

In general, the scanning waveform is a beam of light emitted by the LIDAR 124 with known characteristics of wavelength, intensity/amplitude, and so on. Moreover, the LIDAR 124 may provide more than one beam and also provides the one or more beams in, for example, a continuous or semi-continuous manner while scanning. The LIDAR 124 scans the object by moving a direction in which the beam is emitted about, at least, a general area of the object. Thus, the scanning waveform is directed to a surface of the object so that the general shape and location of the object can be determined along with the surface properties.

At 320, the learning module 220 acquires a reflected waveform. In one embodiment, the learning module 220 receives the reflected waveform resulting from the scanning waveform encountering the surface of the object in the form of, for example, detected attributes of the reflected waveform as determined by the LIDAR 124. That is, the LIDAR 124 uses one or more embedded detectors to detect characteristics/attributes of the reflected waveform. In one embodiment, the characteristics include a wavelength, a phase, an intensity, and/or other identifying characteristics.

Moreover, while the surface of the object is generally discussed as a unitary element, in various embodiments, the object may have multiple different surfaces and, thus, the learning module 220 can acquire reflected waveforms from a plurality of different surfaces of the single object. Additionally, while a single object is discussed, in general, the learning module 220 obtains reflected waveforms from a plurality of objects with known surface properties so that the database 240 can be populated with data about reflected waveforms from a wide range of different surfaces.

Figure 4:
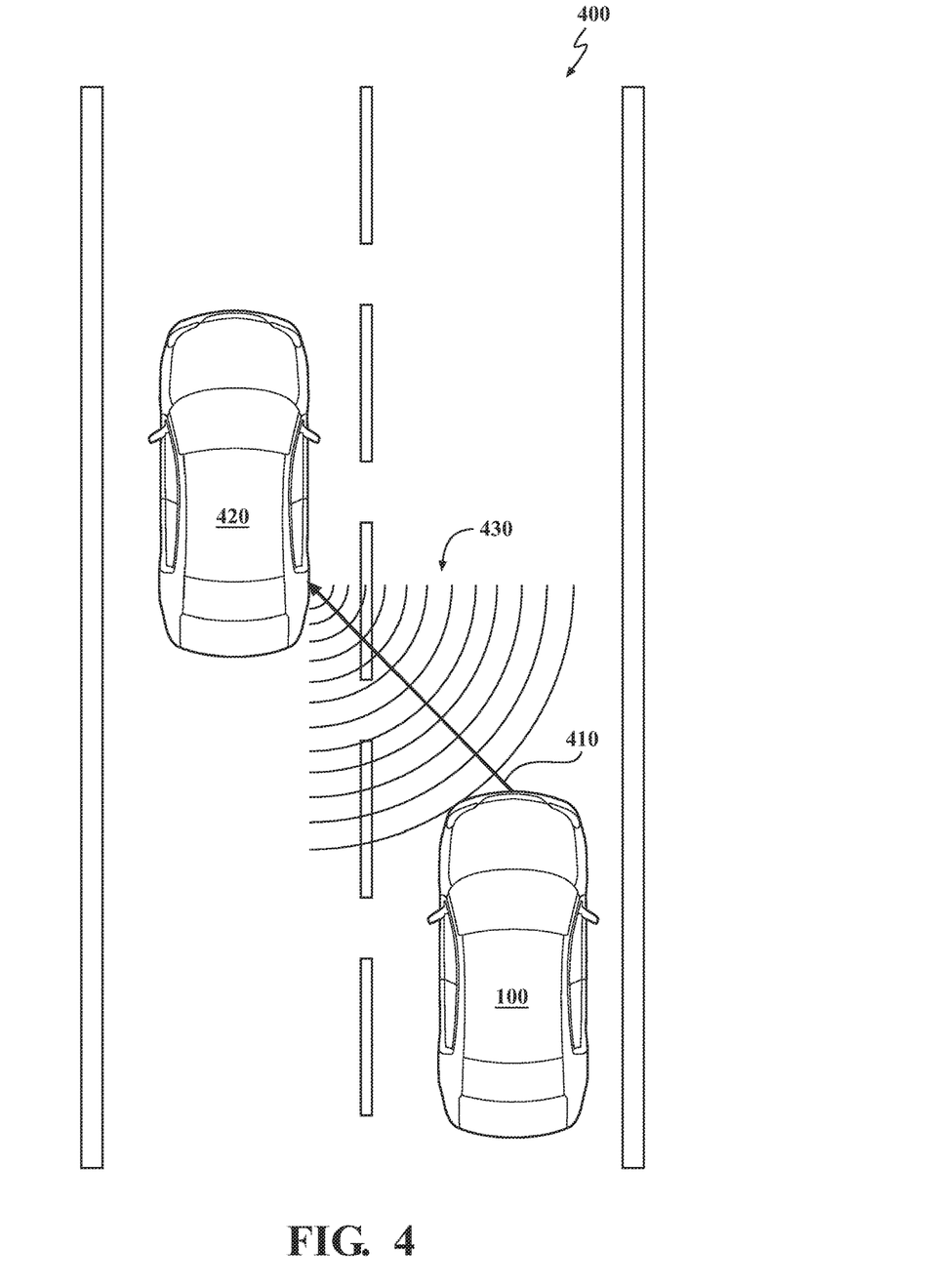
FIG. 4 illustrates a diagram of a LIDAR sensor that is mounted to a first vehicle scanning a second vehicle.

As one example, FIG. 4 illustrates a diagram 400 of the vehicle 100 emitting a scanning waveform 410. The scanning waveform 410 is emitted by the LIDAR sensor 124 at the request of the learning module 220 to scan an object 420. The object 420 is, for example, a vehicle, person, building, roadway, geospatial feature, or generally any surface in an area proximate to the vehicle 100 that has known surface properties. Accordingly, the scanning waveform 410 encounters a surface of the object 420. The scanning waveform is altered by and reflects from the surface to produce a reflected waveform 430. The reflected waveform 430 is generally transformed by the surface of the object 420. That is, the surface of the object 420 disperses the scanning waveform 410 and can alter attributes of the scanning waveform 410 to produce the reflected waveform 430 such that attributes of the reflected waveform 430 differ from the scanning waveform 410 as a function of the surface properties. The surface properties include, for example, a type (e.g., material), a normal of the surface, a color, and so on. The reflected waveform is returned to the LIDAR 124 over time as a function of the surface of the object 420.

At 330, the learning module 220 logs the reflected waveform along with the known surface properties. In one embodiment, the learning module 220 produces a log that correlates known surface properties with reflected waveforms corresponding to the surface properties. Thus, the learning module 220 can label or otherwise identify the reflected waveforms according to which surface properties correspond to the reflected waveforms. Moreover, the learning module 220 can also indicate associated properties of the scanning waveform that originated the reflected waveform in order to, for example, log changes between the two waveforms as an additional data component of the log. As previously noted, the reflected waveform itself is generally not stored. Instead, the learning module 220 stores quantized attributes of the reflected waveform that are detected by the LIDAR 124. Thus, the resulting log produced by the learning module 220 can include a variety of information about the reflected waveform, the surface of the object, and the scanning waveform.

At 340, the learning module 220 stores the log. In one embodiment, the learning module 220 stores the log in the database 240. Alternatively, or additionally, the learning module 220 can store the log in the memory 210, in a distributed or cloud-based memory, or another suitable data store. Thus, in various embodiments, the learning module 220 can gather the information for the log and upload the data in order to report the data and accumulate a large data set to train the surface property model 250. In either case, the log is electronically stored for subsequent analysis.

At 350, the learning module 220 analyzes the log. In one embodiment, the learning module 220 analyzes the log to identify correlations/relationships between the reflected waveforms and the surface properties. Thus, as previously indicated, the learning module 220 can compute the surface property model 250 by processing the logged data according to one or more machine/deep learning techniques. In one embodiment, the learning module 220 processes the logged data according to a supervised learning algorithm (e.g., Naïve Bayes) in the form of a generative or discriminative approach. Alternatively, the learning module 220 can implement an unsupervised learning algorithm, a reinforcement learning algorithm, a deep learning algorithm (e.g., deep convolutional/recurrent neural network) or another suitable analysis.

In either case, the learning module 220 uses the log of the reflected waveforms from 340 as a training data set to produce the surface property model 250 according to one or more of the noted approaches. Consequently, the surface property model 250 embodies relationships between the reflected waveforms and surface properties of objects and, thus, can be used to subsequently estimate surface properties from reflected waveforms.

At 360, the learning module 220 provides the surface property model 250 as a function of the identified correlations. In one embodiment, the learning module 220 provides the surface property model 250 by loading the surface property model 250 into the database 240 and/or into the memory 210 for use by the identification module 230. Alternatively, the learning module 220 loads the surface property model 250 from a remote service. Moreover, in one embodiment, the surface property model 250 along with the identification module 230 are embedded within the LIDAR sensor 124. Furthermore, an entirety of the surface identification system 170 can be embedded within the LIDAR sensor 124, in one embodiment. In either case, embedding the noted components within the LIDAR sensor 124 can reduce a burden of transferring data over a data bus or other communication path and thus improve the efficiency of computations.

Figure 5:
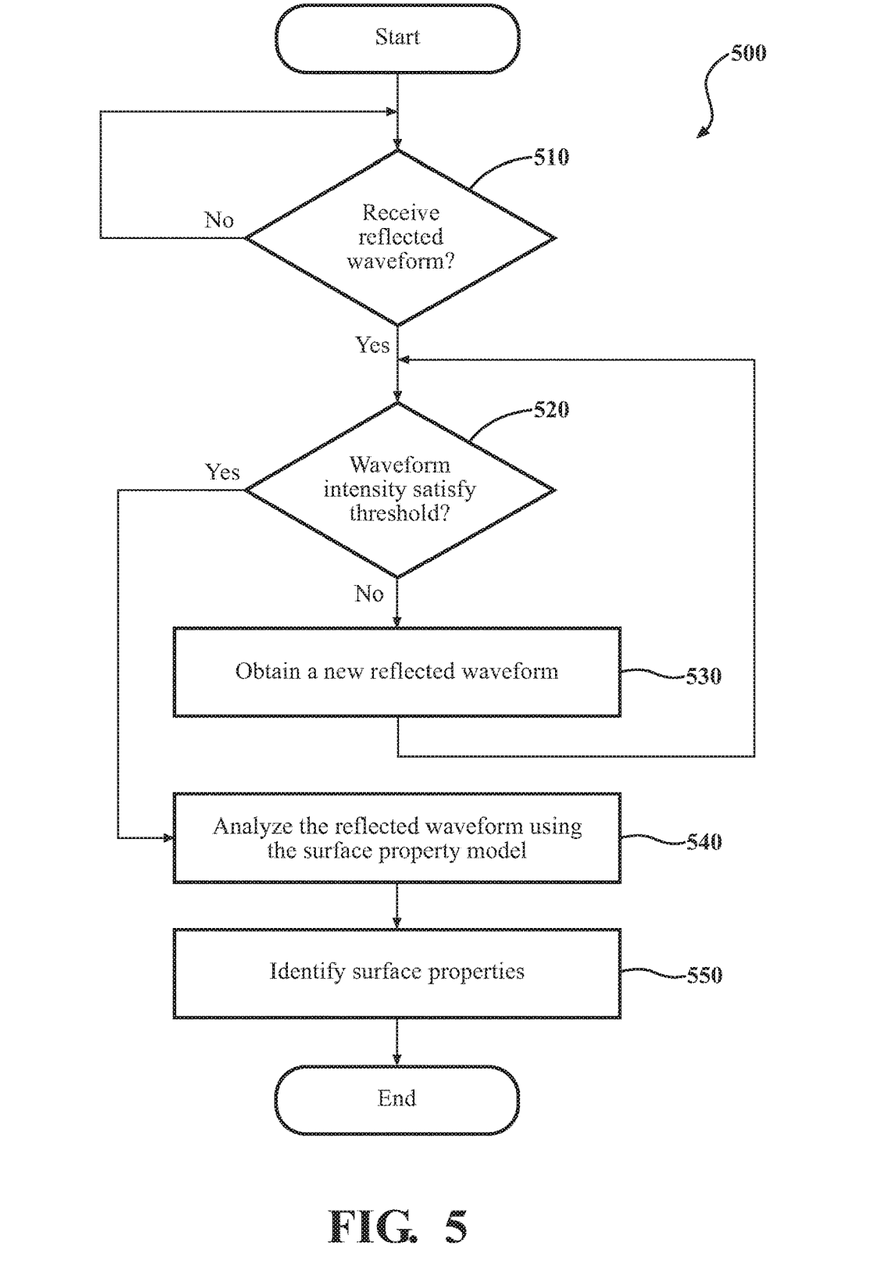
FIG. 5 illustrates one embodiment of a method that is associated with identifying surface properties of an object from a reflected waveform.

FIG. 5 illustrates a flowchart of a method 500 that is associated with identifying surface properties of objects as a function of waveforms reflected from the objects. Method 500 will be discussed from the perspective of the surface identification system 170 of FIGS. 1 and 2. While method 500 is discussed in combination with the surface identification system 170, it should be appreciated that the method 500 is not limited to being implemented within the surface identification system 170, but is instead one example of a system that may implement the method 300.

At 510, the identification module 230 receives a reflected waveform. In one embodiment, the reflected waveform is received as a result of emitting a scanning waveform to detect, for example, a distance to an object in an environment surrounding the vehicle 100. That is, as the vehicle 100 operates in either an autonomous, semi-autonomous, or a manual mode, the vehicle 100 collects information about the surrounding environment for various tasks. The tasks may include populating an obstacle map, determining environmental conditions (e.g., weather, road conditions, etc.), identifying security risks, locating the vehicle within an environment, and so on. In either case, the reflected waveform provides information about a distance of an object, and a shape, but also includes information about surface properties of an object encountered by the reflected waveform. Thus, the reflected waveform can include encoded information about a roadway surface, a nearby vehicle, a person, a traffic sign/light, a building exterior, and so on. This information can include various surface properties such as color, material type (e.g., metal, asphalt, etc.), roughness, a surface normal, and so on. However, the information about the surface of the object is encoded within the reflected waveform and, thus, the identification module 230 processes the reflected waveform to decode or otherwise determine the information.

At 520, the identification module 230 determines whether an intensity of the reflected waveform satisfies an intensity threshold. In one embodiment, the identification module 230 filters waveforms received by the LIDAR sensor 124 that are below a defined intensity threshold. The intensity threshold is, for example, a lower bound of an intensity for a waveform at which characteristics of the waveform are determinate to an acceptable confidence interval. Consequently, the identification module 230 compares an intensity of the reflected waveform against the intensity threshold. If the intensity satisfies the threshold (e.g., is greater than), then the identification module 230 proceeds to analyze the reflected waveform at block 540.

However, in one embodiment, when the identification module 230 receives a reflected waveform that does not satisfy the threshold, the identification module 230 undertakes an additional verification. Accordingly, the identification module 230 can activate one or more sensors of the sensor system 120 to detect whether an object is present proximate to the vehicle 100. The identification module 230, for example, queries the camera(s) 126 to obtain one or more images so that an object can be detected, if present. Consequently, when the presence of an object is verified through another one of the sensors, then the identification module 230 attempts to acquire another reflected waveform as discussed at block 530. Otherwise, the identification module 230, for example, filters the reflected waveform from a data stream and proceeds by monitoring for additional waveforms at block 510.

At 530, the identification module 230 acquires an additional reflected waveform. In one embodiment, the identification module 230 acquires the additional/new waveform by, for example, controlling the LIDAR sensor 124 to increase a gain of an emitted scanning waveform and directing the newly generated scanning waveform at the object. Thus, the identification module 230 controls the LIDAR sensor 124 to emit the scanning waveform with a defined set of characteristics, and, more particularly, with an increased gain/intensity upon detecting a reflected waveform with a sub-threshold intensity, but for which the presence of an object has been verified. Thus, the identification module 230 upon obtaining the newly reflected waveform re-assesses the intensity against the intensity threshold at block 520.

At 540, the identification module 230 analyzes the reflected waveform according to a surface property model 250. In one embodiment, the identification module 230 in combination with the surface property model 250 form a learning network or a simulation process that intakes the reflected waveforms and outputs an estimate of attributes of the surface. As previously indicated, the surface property model 250 characterizes surface properties of objects as a function of characteristics of reflected waveforms from the objects. Thus, the identification module 230 analyzes the reflected waveform by, for example, isolating the characteristics (e.g., intensity, changes in wavelength, etc.) and then uses the characteristics as inputs to the surface property model 250. The provided estimate indicates, in one embodiment, a color, a roughness, a normal, and other properties of the surface of the object.

Alternatively, the surface property model 250 is, in one embodiment, implemented as a look-up table that correlates reflected waveform characteristics to known surface properties. Accordingly, the identification module 230 uses the characteristics of the reflected waveform as input to the look-up and obtains identifiers of surface attributes as an estimate. Moreover, in one embodiment, the surface property model 250 also provides, for example, a confidence interval to characterize how closely the provided estimate correlates with the identified surface attributes.

At 550, the identification module 230 provides an estimate of the surface properties of the object. For example, the identification module 230 can determine whether the estimate is within an acceptable confidence interval, whether the estimate correlates with other perceived information (e.g., camera images), and so on. The identification module 230 can then provide the estimate as an output to other systems or, for example, logs the estimate if the identification module 230 determines the estimate is unsatisfactory. In one embodiment, the identification module 230 uses the estimate to classify the surface as a complex surface type such as a painted surface, wet surface, and so on. In other embodiments, the identification module 230 identifies a material type of the surface as, for example, vegetation (e.g., grass), dirt, metal, wood, brick, etc The identification module 230 can also identify a color of the surface a surface normal, and so on.

Accordingly, in one embodiment, the identification module 230 provides the estimate to an autonomous driving module 160 or another component/system of the vehicle 100 for further use. For example, the autonomous driving module 160 may use the estimate to further populate the map data 116, to inform a trajectory planning component of road and other environmental conditions, and so on. In general, the identification module 230 increases information that is available about objects within the environment and thus improves upon a situational awareness of the vehicle 100 and passengers of the vehicle 100. In this way, the surface identification system 170 uses the LIDAR sensor 124 to obtain information that was previously unavailable.

FIG. 1 will now be discussed in full detail as an example environment within which the system and methods disclosed herein may operate. In some instances, the vehicle 100 is configured to switch selectively between an autonomous mode, one or more semi-autonomous operational modes, and/or a manual mode. Such switching can be implemented in a suitable manner, now known or later developed. "Manual mode" means that all of or a majority of the navigation and/or maneuvering of the vehicle is performed according to inputs received from a user (e.g., human driver). In one or more arrangements, the vehicle 100 can be a conventional vehicle that is configured to operate in only a manual mode.

In one or more embodiments, the vehicle 100 is an autonomous vehicle. As used herein, "autonomous vehicle" refers to a vehicle that operates in an autonomous mode. "Autonomous mode" refers to navigating and/or maneuvering the vehicle 100 along a travel route using one or more computing systems to control the vehicle 100 with minimal or no input from a human driver. In one or more embodiments, the vehicle 100 is highly automated or completely automated. In one embodiment, the vehicle 100 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 100 along a travel route.

The vehicle 100 can include one or more processors 110. In one or more arrangements, the processor(s) 110 can be a main processor of the vehicle 100. For instance, the processor(s) 110 can be an electronic control unit (ECU). The vehicle 100 can include one or more data stores 115 for storing one or more types of data. The data store 115 can include volatile and/or non-volatile memory. Examples of suitable data stores 115 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 115 can be a component of the processor(s) 110, or the data store 115 can be operatively connected to the processor(s) 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. The map data 116 can be in any suitable form. In some instances, the map data 116 can include aerial views of an area. In some instances, the map data 116 can include ground views of an area, including 360-degree ground views. The map data 116 can include measurements, dimensions, distances, and/or information for one or more items included in the map data 116 and/or relative to other items included in the map data 116. The map data 116 can include a digital map with information about road geometry. The map data 116 can be high quality and/or highly detailed.

In one or more arrangement, the map data 116 can include one or more terrain maps 117. The terrain map(s) 117 can include information about the ground, terrain, roads, surfaces, and/or other features of one or more geographic areas. The terrain map(s) 117 can include elevation data in the one or more geographic areas. The map data 116 can be high quality and/or highly detailed. The terrain map(s) 117 can define one or more ground surfaces, which can include paved roads, unpaved roads, land, and other things that define a ground surface.

In one or more arrangement, the map data 116 can include one or more static obstacle maps 118. The static obstacle map(s) 118 can include information about one or more static obstacles located within one or more geographic areas. A "static obstacle" is a physical object whose position does not change or substantially change over a period of time and/or whose size does not change or substantially change over a period of time. Examples of static obstacles include trees, buildings, curbs, fences, railings, medians, utility poles, statues, monuments, signs, benches, furniture, mailboxes, large rocks, hills. The static obstacles can be objects that extend above ground level. The one or more static obstacles included in the static obstacle map(s) 118 can have location data, size data, dimension data, material data, and/or other data associated with it. The static obstacle map(s) 118 can include measurements, dimensions, distances, and/or information for one or more static obstacles. The static obstacle map(s) 118 can be high quality and/or highly detailed. The static obstacle map(s) 118 can be updated to reflect changes within a mapped area.

The one or more data stores 115 can include sensor data 119. In this context, "sensor data" means any information about the sensors that the vehicle 100 is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information on one or more LIDAR sensors 124 of the sensor system 120.

In some instances, at least a portion of the map data 116 and/or the sensor data 119 can be located in one or more data stores 115 located onboard the vehicle 100. Alternatively, or in addition, at least a portion of the map data 116 and/or the sensor data 119 can be located in one or more data stores 115 that are located remotely from the vehicle 100.

As noted above, the vehicle 100 can include the sensor system 120. The sensor system 120 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors can work independently from each other. Alternatively, two or more of the sensors can work in combination with each other. In such case, the two or more sensors can form a sensor network. The sensor system 120 and/or the one or more sensors can be operatively connected to the processor(s) 110, the data store(s) 115, and/or another element of the vehicle 100 (including any of the elements shown in FIG. 1). The sensor system 120 can acquire data of at least a portion of the external environment of the vehicle 100 (e.g., nearby vehicles).

The sensor system 120 can include any suitable type of sensor. Various examples of different types of sensors will be described herein. However, it will be understood that the embodiments are not limited to the particular sensors described. The sensor system 120 can include one or more vehicle sensors 121. The vehicle sensor(s) 121 can detect, determine, and/or sense information about the vehicle 100 itself. In one or more arrangements, the vehicle sensor(s) 121 can be configured to detect, and/or sense position and orientation changes of the vehicle 100, such as, for example, based on inertial acceleration. In one or more arrangements, the vehicle sensor(s) 121 can include one or more accelerometers, one or more gyroscopes, an inertial measurement unit (IMU), a dead-reckoning system, a global navigation satellite system (GNSS), a global positioning system (GPS), a navigation system 147, and/or other suitable sensors. The vehicle sensor(s) 121 can be configured to detect, and/or sense one or more characteristics of the vehicle 100. In one or more arrangements, the vehicle sensor(s) 121 can include a speedometer to determine a current speed of the vehicle 100.

Alternatively, or in addition, the sensor system 120 can include one or more environment sensors 122 configured to acquire, and/or sense driving environment data. "Driving environment data" includes and data or information about the external environment in which an autonomous vehicle is located or one or more portions thereof. For example, the one or more environment sensors 122 can be configured to detect, quantify and/or sense obstacles in at least a portion of the external environment of the vehicle 100 and/or information/data about such obstacles. Such obstacles may be stationary objects and/or dynamic objects. The one or more environment sensors 122 can be configured to detect, measure, quantify and/or sense other things in the external environment of the vehicle 100, such as, for example, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. However, it will be understood that the embodiments are not limited to the particular sensors described.

As an example, in one or more arrangements, the sensor system 120 can include one or more radar sensors 123, one or more LIDAR sensors 124, one or more sonar sensors 125, and/or one or more cameras 126. In one or more arrangements, the one or more cameras 126 can be high dynamic range (HDR) cameras or infrared (IR) cameras.

The vehicle 100 can include an input system 130. An "input system" includes any device, component, system, element or arrangement or groups thereof that enable information/data to be entered into a machine. The input system 130 can receive an input from a vehicle passenger (e.g. a driver or a passenger). The vehicle 100 can include an output system 135. An "output system" includes any device, component, or arrangement or groups thereof that enable information/data to be presented to a vehicle passenger (e.g. a person, a vehicle passenger, etc.).

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, each or any of the systems or portions thereof may be otherwise combined or segregated via hardware and/or software within the vehicle 100. The vehicle 100 can include a propulsion system 141, a braking system 142, a steering system 143, throttle system 144, a transmission system 145, a signaling system 146, and/or a navigation system 147. Each of these systems can include one or more devices, components, and/or a combination thereof, now known or later developed.

The navigation system 147 can include one or more devices, applications, and/or combinations thereof, now known or later developed, configured to determine the geographic location of the vehicle 100 and/or to determine a travel route for the vehicle 100. The navigation system 147 can include one or more mapping applications to determine a travel route for the vehicle 100. The navigation system 147 can include a global positioning system, a local positioning system or a geolocation system.

The processor(s) 110, the surface identification system 170, and/or the autonomous driving module(s) 160 can be operatively connected to communicate with the various vehicle systems 140 and/or individual components thereof. For example, returning to FIG. 1, the processor(s) 110 and/or the autonomous driving module(s) 160 can be in communication to send and/or receive information from the various vehicle systems 140 to control the movement, speed, maneuvering, heading, direction, etc. of the vehicle 100. The processor(s) 110, the surface identification system 170, and/or the autonomous driving module(s) 160 may control some or all of these vehicle systems 140 and, thus, may be partially or fully autonomous.

The processor(s) 110, the surface identification system 170, and/or the autonomous driving module(s) 160 can be operatively connected to communicate with the various vehicle systems 140 and/or individual components thereof. For example, returning to FIG. 1, the processor(s) 110, the surface identification system 170, and/or the autonomous driving module(s) 160 can be in communication to send and/or receive information from the various vehicle systems 140 to control the movement, speed, maneuvering, heading, direction, etc. of the vehicle 100. The processor(s) 110, the surface identification system 170, and/or the autonomous driving module(s) 160 may control some or all of these vehicle systems 140.

The processor(s) 110, the surface identification system 170, and/or the autonomous driving module(s) 160 may be operable to control the navigation and/or maneuvering of the vehicle 100 by controlling one or more of the vehicle systems 140 and/or components thereof. For instance, when operating in an autonomous mode, the processor(s) 110, the surface identification system 170, and/or the autonomous driving module(s) 160 can control the direction and/or speed of the vehicle 100. The processor(s) 110, the surface identification system 170, and/or the autonomous driving module(s) 160 can cause the vehicle 100 to accelerate (e.g., by increasing the supply of fuel provided to the engine), decelerate (e.g., by decreasing the supply of fuel to the engine and/or by applying brakes) and/or change direction (e.g., by turning the front two wheels). As used herein, "cause" or "causing" means to make, force, compel, direct, command, instruct, and/or enable an event or action to occur or at least be in a state where such event or action may occur, either in a direct or indirect manner.

The vehicle 100 can include one or more actuators 150. The actuators 150 can be any element or combination of elements operable to modify, adjust and/or alter one or more of the vehicle systems 140 or components thereof to responsive to receiving signals or other inputs from the processor(s) 110 and/or the autonomous driving module(s) 160. Any suitable actuator can be used. For instance, the one or more actuators 150 can include motors, pneumatic actuators, hydraulic pistons, relays, solenoids, and/or piezoelectric actuators, just to name a few possibilities.

The vehicle 100 can include one or more modules, at least some of which are described herein. The modules can be implemented as computer-readable program code that, when executed by a processor 110, implement one or more of the various processes described herein. One or more of the modules can be a component of the processor(s) 110, or one or more of the modules can be executed on and/or distributed among other processing systems to which the processor(s) 110 is operatively connected. The modules can include instructions (e.g., program logic) executable by one or more processor(s) 110. Alternatively, or in addition, one or more data store 115 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

The vehicle 100 can include one or more autonomous driving modules 160. The autonomous driving module(s) 160 can be configured to receive data from the sensor system 120 and/or any other type of system capable of capturing information relating to the vehicle 100 and/or the external environment of the vehicle 100. In one or more arrangements, the autonomous driving module(s) 160 can use such data to generate one or more driving scene models. The autonomous driving module(s) 160 can determine position and velocity of the vehicle 100. The autonomous driving module(s) 160 can determine the location of obstacles, obstacles, or other environmental features including traffic signs, trees, shrubs, neighboring vehicles, pedestrians, etc.

The autonomous driving module(s) 160 can be configured to receive, and/or determine location information for obstacles within the external environment of the vehicle 100 for use by the processor(s) 110, and/or one or more of the modules described herein to estimate position and orientation of the vehicle 100, vehicle position in global coordinates based on signals from a plurality of satellites, or any other data and/or signals that could be used to determine the current state of the vehicle 100 or determine the position of the vehicle 100 with respect to its environment for use in either creating a map or determining the position of the vehicle 100 in respect to map data.

The autonomous driving module(s) 160 either independently or in combination with the surface identification system 170 can be configured to determine travel path(s), current autonomous driving maneuvers for the vehicle 100, future autonomous driving maneuvers and/or modifications to current autonomous driving maneuvers based on data acquired by the sensor system 120, driving scene models, and/or data from any other suitable source. "Driving maneuver" means one or more actions that affect the movement of a vehicle. Examples of driving maneuvers include: accelerating, decelerating, braking, turning, moving in a lateral direction of the vehicle 100, changing travel lanes, merging into a travel lane, and/or reversing, just to name a few possibilities. The autonomous driving module(s) 160 can be configured can be configured to implement determined driving maneuvers. The autonomous driving module(s) 160 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 160 can be configured to execute various vehicle functions and/or to transmit data to, receive data from, interact with, and/or control the vehicle 100 or one or more systems thereof (e.g. one or more of vehicle systems 140).

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-2, but the embodiments are not limited to the illustrated structure or application.

The flowcharts and block diagrams in the figures illustrate the architecture, functionality, and operation of possible implementations of systems, methods and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g. AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A surface identification system for identifying surface properties of objects using a light detection and ranging (LIDAR) sensor, comprising:
   one or more processors;
   a memory communicably coupled to the one or more processors and storing:
   an identification module including instructions that when executed by the one or more processors cause the one or more processors to, in response to scanning a surface of an object using the LIDAR sensor, receive a reflected waveform as a function of attributes of the surface,
   analyze the reflected waveform according to changes between the reflected waveform and a scanning waveform as characterized by a surface property model to produce an estimate of the attributes, wherein the surface property model characterizes relationships between reflected waveforms and different surface properties including changes in at least wavelength and intensity; and
   provide the estimate as an indication of the surface of the scanned object.

2. The surface identification system of claim 1, further comprising:
   a learning module including instructions that when executed by the one or more processors cause the one or more processors to generate the surface property model by:
   acquiring reflected waveforms from a plurality of objects with known surface properties;
   logging the reflected waveforms along with the known surface properties to produce a log that associates the reflected waveforms with the known surface properties;
   analyzing the log to identify correlations between the reflected waveforms and the known surface properties; and
   providing the surface property model as a function of the correlations.

3. The surface identification system of claim 1, wherein the identification module further includes instructions to:
   determine (i) whether an intensity of the reflected waveform satisfies an intensity threshold, and (ii) whether additional sensors integrated within a first vehicle that includes the LIDAR sensor detect a second vehicle proximate to the first vehicle, and
   acquire an additional reflected waveform using a scanning waveform with an increased gain when the object is determined to be the second vehicle, and the intensity does not satisfy the threshold.

4. The surface identification system of claim 1, wherein the identification module further includes instructions to analyze the reflected waveform by using the surface property model as a look-up table to obtain the estimate according to characteristics of the reflected waveform as linked to the different surface properties by the relationships, and wherein the reflected waveform embodies changes to a scanning waveform caused by the attributes of the surface.

5. The surface identification system of claim 4, wherein the identification module further includes instructions to scan the object by emitting the scanning waveform with a defined set of properties and by receiving the reflected waveform as a function of the surface of the object transforming the scanning waveform.

6. The surface identification system of claim 1, wherein the identification module further includes instructions to provide the estimate of the attributes by indicating at least an angle of incidence, and a surface color of the object, and
wherein the surface property model characterizes the relationships including changes in phase.

7. The surface identification system of claim 1, wherein the identification module further includes instructions to analyze the reflected waveform by analyzing the reflected waveform within the LIDAR sensor and according to a learning algorithm, and
wherein the identification module including instructions to analyze the reflected waveform including instructions to identify a type of the surface according to correlations between the attributes of the surface.

8. The surface identification system of claim 7, wherein the learning algorithm is a supervised learning algorithm.

9. A non-transitory computer-readable medium storing instructions that when executed by one or more processors cause the one or more processors to:
in response to scanning a surface of an object using a light detection and ranging (LIDAR) sensor, receive a reflected waveform as a function of attributes of the surface,
analyze the reflected waveform according to changes between the reflected waveform and a scanning waveform as characterized by a surface property model to produce an estimate of the attributes, wherein the surface property model characterizes relationships between reflected waveforms and different surface properties including changes in at least wavelength and intensity; and
provide the estimate as an indication of the surface of the scanned object.

10. The non-transitory computer-readable medium of claim 9, wherein the instructions further include instructions to:
determine (i) whether an intensity of the reflected waveform satisfies an intensity threshold, and (ii) whether additional sensors integrated within a first vehicle that includes the LIDAR sensor detect a second vehicle proximate to the first vehicle, and
acquire an additional reflected waveform using a scanning waveform with an increased gain when the object is determined to be the second vehicle, and the intensity does not satisfy the threshold.

11. The non-transitory computer-readable medium of claim 9, wherein the instructions to analyze the reflected waveform include instructions to use the surface property model as a look-up table to obtain the estimate according to characteristics of the reflected waveform as linked to the different surface properties by the relationships, wherein the reflected waveform embodies changes to a scanning waveform caused by the attributes of the surface, and
wherein the surface property model characterizes the relationships including changes in phase.

12. The non-transitory computer-readable medium of claim 11, wherein the instructions to scan the object include instructions to emit the scanning waveform with a defined set of properties and to receive the reflected waveform as a function of the surface of the object transforming the scanning waveform, and
wherein the instructions to analyze the reflected waveform include instructions to identify a type of the surface according to correlations between the attributes of the surface.

13. The non-transitory computer-readable medium of claim 9, further comprising instructions to generate the surface property model by:

acquiring reflected waveforms from a plurality of objects with known surface properties;
logging the reflected waveforms along with the known surface properties to produce a log that associates the reflected waveforms with the known surface properties;
analyzing the log to identify correlations between the reflected waveforms and the known surface properties; and
providing the surface property model as a function of the correlations.

14. A method of identifying surface properties of objects using a light detection and ranging (LIDAR) sensor, comprising:
in response to scanning a surface of an object using the LIDAR sensor, receiving a reflected waveform as a function of attributes of the surface;
analyzing the reflected waveform according to changes between the reflected waveform and a scanning waveform as characterized by a surface property model to produce an estimate of the attributes, wherein the surface property model characterizes relationships between reflected waveforms and different surface properties including changes in at least wavelength and intensity; and
providing the estimate as an indication of the surface of the scanned object.

15. The method of claim 14, further comprising:
generating the surface property model by:
acquiring reflected waveforms from a plurality of objects with known surface properties;
logging the reflected waveforms along with the known surface properties to produce a log that associates the reflected waveforms with the known surface properties;
analyzing the log to identify correlations between the reflected waveforms and the known surface properties; and
providing the surface property model as a function of the correlations.

16. The method of claim 14, further comprising:
determining (i) whether an intensity of the reflected waveform satisfies an intensity threshold, and (ii) whether additional sensors integrated within a first vehicle that includes the LIDAR sensor detect a second vehicle proximate to the first vehicle; and
acquiring an additional reflected waveform using a scanning waveform with an increased gain when the object is determined to be the second vehicle and the intensity does not satisfy the threshold.

17. The method of claim 14, wherein analyzing the reflected waveform includes using the surface property model as a look-up table to obtain the estimate according to characteristics of the reflected waveform as linked to the different surface properties by the relationships, and wherein the reflected waveform embodies changes to a scanning waveform caused by the attributes of the surface.

18. The method of claim 17, wherein scanning the object includes emitting the scanning waveform with a defined set of properties and receiving the reflected waveform as a function of the surface of the object transforming the scanning waveform.

19. The method of claim 14, wherein providing the estimate of the attributes includes indicating at least an angle of incidence, and a surface color of the object, and
wherein the surface property model characterizes the relationships including changes in phase.

20. The method of claim 14, wherein analyzing the reflected waveform includes analyzing the reflected waveform within the LIDAR sensor and according to a learning algorithm, and
wherein analyzing the reflected waveform includes identifying a type of the surface according to correlations between the attributes of the surface.

* * * * *